United States Patent
Locquet et al.

(10) Patent No.: US 10,290,519 B2
(45) Date of Patent: May 14, 2019

(54) HOT JET ASSISTED SYSTEMS AND METHODS

(71) Applicant: KATHOLIEKE UNIVERSITEIT LEUVEN, Leuven (BE)

(72) Inventors: Jean-Pierre Locquet, Haasrode (BE); Chen-Yi Su, Taoyuan (TW)

(73) Assignee: KATHOLIEKE UNIVERSITEIT LEUVEN, Leuven (BE)

( * ) Notice: Subject to any disclaimer, the term of this patent is extended or adjusted under 35 U.S.C. 154(b) by 0 days.

(21) Appl. No.: 15/500,213

(22) PCT Filed: Jul. 31, 2015

(86) PCT No.: PCT/EP2015/067757
§ 371 (c)(1),
(2) Date: Jan. 30, 2017

(87) PCT Pub. No.: WO2016/016465
PCT Pub. Date: Feb. 4, 2016

(65) Prior Publication Data
US 2017/0263475 A1    Sep. 14, 2017

Related U.S. Application Data

(60) Provisional application No. 62/031,768, filed on Jul. 31, 2014.

(51) Int. Cl.
*B05C 13/02* (2006.01)
*H01L 21/67* (2006.01)
(Continued)

(52) U.S. Cl.
CPC ...... *H01L 21/67109* (2013.01); *C23C 14/228* (2013.01); *C23C 14/5806* (2013.01);
(Continued)

(58) Field of Classification Search
CPC ... H05B 2203/035; H05B 6/10; H05B 6/6408
See application file for complete search history.

(56) References Cited

U.S. PATENT DOCUMENTS 5,068,871 A * 11/1991 Uchida ................ C23C 16/271
                                                      118/715
5,665,277 A *  9/1997 Johnson .................. B01J 13/02
                                                      264/10

(Continued)

FOREIGN PATENT DOCUMENTS

DE      4408052 C1    4/1995
JP    2000223416 A    8/2000

OTHER PUBLICATIONS

International Search Report for corresponding International PCT Application No. PCT/EP2015/067757, dated Sep. 22, 2015.

*Primary Examiner* — Selim U Ahmed
*Assistant Examiner* — Andre C Stevenson
(74) *Attorney, Agent, or Firm* — Workman Nydegger

(57) ABSTRACT

A heating device for heating the surface of a substrate. The heating device comprises a gas source comprising an inert material supply inert under the operating conditions of the heating device, the gas source being adapted for supplying a hot jet of a gas comprising at least elements of said inert material on the substrate. The gas source is adapted for heating the hot jet of the gas to a temperature above 1500° C.

17 Claims, 1 Drawing Sheet

(51) Int. Cl.
  *C23C 14/22* (2006.01)
  *C23C 14/58* (2006.01)
  *C23C 16/56* (2006.01)
  *H01L 21/02* (2006.01)
  *H01L 21/687* (2006.01)

(52) U.S. Cl.
  CPC ........ *C23C 16/56* (2013.01); *H01L 21/02175* (2013.01); *H01L 21/02178* (2013.01); *H01L 21/02266* (2013.01); *H01L 21/02337* (2013.01); *H01L 21/02356* (2013.01); *H01L 21/02527* (2013.01); *H01L 21/02529* (2013.01); *H01L 21/02565* (2013.01); *H01L 21/02631* (2013.01); *H01L 21/02689* (2013.01); *H01L 21/68714* (2013.01)

(56) References Cited

U.S. PATENT DOCUMENTS

| | | | | |
|---|---|---|---|---|
| 2009/0032612 | A1* | 2/2009 | Kunstmann | B05B 16/20 |
| | | | | 239/102.2 |
| 2010/0052218 | A1* | 3/2010 | Clark | C30B 11/003 |
| | | | | 264/299 |
| 2014/0174360 | A1 | 6/2014 | Huh et al. | |
| 2015/0047467 | A1* | 2/2015 | Ruud | C01B 21/06 |
| | | | | 75/338 |

* cited by examiner

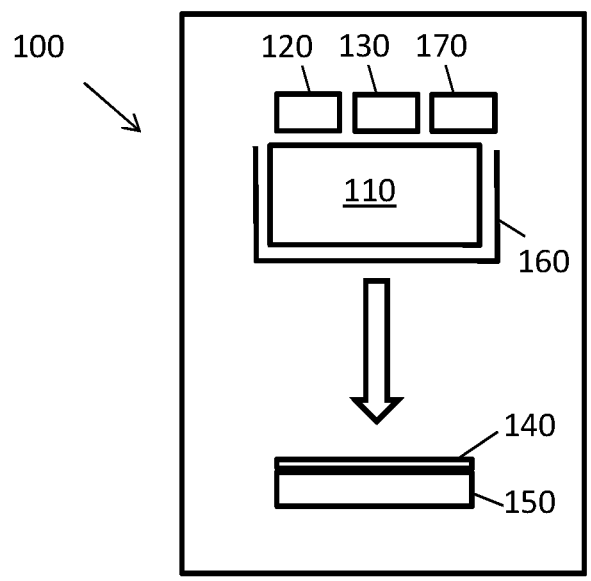

HOT JET ASSISTED SYSTEMS AND METHODS

FIELD OF THE INVENTION

The invention relates to the field of thin film related cleaning, etching and deposition techniques useful in the fields of electronics, photonics, material engineering, surface engineering, energy as well as biomedical applications.

BACKGROUND OF THE INVENTION

Currently thin film processes typically require a high temperature step to form a high quality and relatively defect free phase. Indeed, the crystallization process of a material usually requires rather high temperature. However, for thin films on a substrate the interactions with the substrate are a limiting factor as diffusion must be avoided as much as possible. Often it is impossible to reconcile these different requirements. For instance for the growth of materials on polymer substrates it is clear that the maximum growth temperatures cannot exceed the glass transition temperature of the polymer. Also, for the growth of oxide films on typical semiconductor substrates, the formation of intermediary phases such as $SiO_2$ on Si cannot be avoided if the substrate temperature becomes too high.

To circumvent these issues, a number of processes have been developed in the art such as the rapid thermal annealing process that anneal the film in a short time after the film growth. However, heating and subsequent cooling of the substrate and the thin film still cause diffusion damage.

Another method currently used in the art is to apply a "direct" or a "remote" plasma to the growing front. This plasma is usually created by a DC, RF, Microwave or ECR type of discharge whereby a whole range of active species is created such as atomic elements, excited atoms and molecules as well as electrons and different ions. When they bombard the surface, inevitably this will also lead to a heating of the substrate surface layer or the thin film growing layer. However, the energetic spectral distribution of these species is usually very large mostly including sputtering of surface atoms, which is not gentile nor electrically neutral.

The main shortcomings in the state of the art are twofold. On the one hand, since the thermal budget during the film formation on a substrate is limited, it is impossible to make a film of a good structural quality. This will limit the overall performance of the said thin film on all fronts. The second main shortcoming is related to the diffusion issues and the large set of "complicated" defects that arise as a consequence. For instance in the case of the gate stack, the diffusion of semiconductor atoms (from Si, Ge, GaAs or InGaAs) into the oxide always leads to poor electrical behavior. Vice versa, the diffusion of metallic, nitrogen or oxide species into the semiconductor also gives rise to unwanted defects into the semiconductor.

Therefore there is a need for more gentle methods and tools to grow, etch and/or anneal thin films.

SUMMARY OF THE INVENTION

It is an object of embodiments of the present invention to provide a heating device and method that allows more gentle heating when growing, etching and/or annealing thin films.

The above objective is accomplished by a method and device according to embodiments of the present invention.

In a first aspect, the present invention provides a heating device for heating the surface of a substrate. The heating device comprises a gas source comprising an inert material supply, the inert material being inert under the operating conditions of the heating device. The gas source is adapted for applying a hot jet of a gas comprising at least elements of the inert material on the substrate and the gas source is adapted for heating the hot jet of the gas to a temperature above 1500° C.

It is an advantage of embodiments of the present invention that the surface of the substrate is heated without heating the rest of the bulk volume of the substrate. In embodiments of the present invention a thin film is present at the surface of the substrate or is growing at the surface of the substrate when being heated by the heating device in accordance with embodiments of the present invention. It is an advantage of embodiments of the present invention that a high temperature step (higher than would be the case of the complete bulk volume of the substrate is heated) can be applied to the thin film at the surface of the substrate such that a high quality and relatively defect free phase can be obtained. It is an advantage of embodiments of the present invention that hot gaseous elements can be supplied to the growing thin film front. It is an advantage of embodiments of the present invention that interactions between the thin film and the substrate are reduced by heating the surface of the substrate using a hot jet instead of heating also the bulk of the substrate. By only heating the surface, diffusion between the thin film and the substrate is reduced compared to the situation wherein all of the substrate is heated. In embodiments of the present invention where polymer substrates are used the temperature of the substrate may not exceed the glass transition temperature of the substrate. It is an advantage of embodiments of the present invention that this can be reduced or even avoided by heating only the surface of the substrate. In embodiments of the present invention the substrate is a semiconductor substrate. It is an advantage of embodiments of the present invention that the formation of intermediary phases, such as for example $SiO_2$ on Si can be reduced or even avoided by heating only the surface of the substrate. It is an advantage of embodiments of the present invention that the thermal budget with regard to the film formation can be increased compared to the thermal budget with regard to the thin film formation when heating the complete substrate instead of only the surface thereof. It is an advantage that thereby the overall performance of the thin film can be increased. It is an advantage of embodiments of the present invention that for example in the case of a gate stack, the diffusion of semiconductor atoms (e.g. from a Si, Ge, GaAs, or InGaAs substrate) into a thin film oxide is reduced or even prevented by heating only the surface of the substrate instead of the complete substrate (the smaller the diffusion the better the electrical behavior). It is an advantage of embodiments of the present invention that the diffusion of for example metallic, nitrogen or oxide species are reduced or even eliminated when heating only the surface of the substrate instead of the complete substrate. By reducing this diffusion into a semiconductor unwanted defects in the semiconductor are reduced. It is an advantage of embodiments of the present invention that the surface of the substrate can be heated to a desired temperature (e.g. for an optimal growth of the thin film) while the bulk of substrate itself can remain colder or can be heated to a predetermined temperature thereby limiting the interactions between the substrate and the thin film. It is an advantage of embodiments of the present invention that the hot jet of the gas is heating the surface area of the substrate without chemical reacting with the surface area of the substrate. It is an advantage that thereby damage of the thin film and/or of the surface area of the substrate is avoided. It is an advantage of embodiments of the present invention that oxidation reactions can be avoided. It is an advantage of embodiments of the present invention that at high enough surface temperature evaporation will take place leading to a cleaning and etching process.

In some embodiments of the present invention the gas source is adapted for applying a hot jet of a gas comprising reactive elements on the substrate.

In some embodiments of the present invention the gas source is adapted for applying a hot jet of a gas comprising only elements of the inert material on the substrate.

In some embodiments of the present invention the gas source is adapted for applying a cold jet of gas of reactive elements on the substrate.

Devices according to some embodiments of the present invention comprise a temperature controller for controlling the temperature of the gas emanating from the gas source and/or a pressure controller for controlling the pressure of the gas emanating from the gas source and/or a flow controller for controlling how much gas is streaming through.

It is an advantage of some embodiments of the present invention that by controlling the temperature and/or the pressure and/or the flow of the gas, the surface temperature of the substrate and depth of heating of the surface of the substrate can be controlled.

In some embodiments of the present invention the gas source is adapted for evaporating elements which have a predetermined atomic radius.

It is an advantage of some embodiments of the present invention that by selecting a gas with a specific atomic radius the penetration depth of the elements of the gas into the substrate can be determined. The size of the atomic radius of the elements determines whether through channeling some of the species will go a bit deeper inside the lattices including for instance through defects. For instance in the case of He it is expected that some He atoms will go deeper below the surface. This can for example be advantageous when crystallizing a unit cell of for example between 0.5 nm an 3 nm thick, for example 1 nm thick (e.g. between 2 and 15 monolayers, e.g. about 5 monolayers.

In some embodiments of the present invention the gas source is an effusion cell with a nearly closed crucible made of graphite and wherein the gas source comprises a heater for heating the crucible wherein the heater comprises filaments made of tantalum or tungsten or wherein the heater comprises an e-beam or wherein the heater comprises a laser beam.

It is an advantage of some embodiments of the present invention that the crucible and the heater elements can stand temperatures above 1500° C. and even up to 2500° C. or even up to 4100° C. It is an advantage of some embodiments of the present invention that gas temperatures of up to 2500° C. or even up to 4100° C. can be reached. It is an advantage of embodiments of the present invention that the crucible is nearly closed causing the gas atoms to heat by colliding with the crucible walls or through collisions or absorption of photons.

In some embodiments of the present invention the gas source is configured for generating a continuous hot jet of gas.

It is an advantage of some embodiments of the present invention that enough energy can be given to the growing surface, using a continuous jet of hot gas, to enable the growth, crystallization or etching of a thin film.

In some embodiments of the present invention the gas source is configured for generating a pulsed hot jet of gas.

It is an advantage of some embodiments of the present invention that placing of atoms (e.g. for forming a thin film) on the substrate can be alternated with heating the surface of the substrate using a pulse of the hot jet of gas. This can for example be any thin film such as MgO on Si or such as Al2O3 on InGaAs.

Devices according to some embodiments of the present invention comprise a substrate holder adapted for cooling and/or heating the substrate.

It is an advantage of some embodiments of the present invention that the substrate can be cooled or heated to adjust the thermal budget to which the surface of the substrate is exposed. This can be optimized for instance to prevent the appearance of defects in the grown material. It is an advantage of some embodiments of the present invention that the substrate holder may be adapted for allowing the substrate temperature to be varied during operation of the device.

Device according to some embodiments of the present invention comprise a cooling shroud wherein the cooling shroud is adapted for being mounted around the gas source such that, when mounted, it is adapted for allowing the hot jet of gas to pass towards the substrate and it is adapted for reducing the heat radiation from the gas source towards the substrate and any other elements which are shielded by the cooling shroud from the gas source.

It is an advantage of some embodiments of the present invention that radiation from the gas source is prevented from reaching the substrate. Thereby heating up of the substrate by radiation coming from a hot gas source is prevented.

In some embodiments of the present invention the gas source is adapted for changing the elements of the gas during operation of the device.

It is an advantage of some embodiments of the present invention that elements of the gas can be changed during the growth of the thin film. It is an advantage that thereby the depth of the heating profile in the substrate can be controlled. This can for example be done by alternating between He and Xe.

In some embodiments of the present invention the gas source is adapted for generating an additional jet of gas below 1500° C.

The additional jet of gas may be sequentially generated with the jet of gas at a temperature above 1500° C. or it may be generated in parallel therewith. It is an advantage of some embodiments of the present invention that a gas source which can combine the generation of a cold gas with a hot gas offers additional process tuning possibilities.

In a second aspect, the present invention provides a method for treating the surface of a substrate, the method comprising a step of heating the surface of the substrate using a hot jet of gas wherein at least part of the elements in the gas are inert under the operating conditions of the heating device and wherein the gas is heated to a temperature above 1500° C.

In embodiments of the present invention the hot jet of gas comprises inert and reactive elements or wherein a hot jet of gas comprising inert elements is alternated with a cold jet of gas comprising reactive elements.

Embodiments according to the present invention comprise a deposit step for depositing sample material for a thin film on the substrate, followed by the heating step which causes an annealing treatment wherein the formed film is crystallized.

It is an advantage of embodiments of the present invention that they can be applied for solid phase epitaxy.

Particular and preferred aspects of the invention are set out in the accompanying independent and dependent claims. Features from the dependent claims may be combined with features of the independent claims and with features of other dependent claims as appropriate and not merely as explicitly set out in the claims.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE DRAWINGS

FIG. 1 is a schematic drawing of a heating device for heating the surface of a substrate in accordance with embodiments of the present invention.

The drawing is only schematic and non-limiting. In the drawing, the size of some of the elements may be exaggerated and not drawn on scale for illustrative purposes.

Any reference signs in the claims shall not be construed as limiting the scope.

DETAILED DESCRIPTION OF ILLUSTRATIVE EMBODIMENTS

The present invention will be described with respect to particular embodiments and with reference to the drawing but the invention is not limited thereto but only by the claims. The drawing described is only schematic and is non-limiting. In the drawing, the size of some of the elements may be exaggerated and not drawn on scale for illustrative purposes. The dimensions and the relative dimensions do not correspond to actual reductions to practice of the invention.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, FIGURE, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where in embodiments of the present invention reference is made to "the substrate temperature" reference is made to the temperature of the bulk of the substrate. This is as opposed to the temperature of the atoms at the top surface of the substrate. The temperature of the bulk of the substrate can for instance be measured using thermocouples implemented into the substrate. Another method is to use a pyrometer instrument or to measure the bandgap of the material.

Where in embodiments of the present invention reference is made to a substrate, this substrate can already be coated with any interface layer, gradient layer, buffer layer, or any other layer on top of which is heated according to embodiments of the present invention. It is advantageous that the heating according to embodiments of the present invention can be applied to substrates with a smooth surface as well as to substrates with a rough surface (e.g. a nanostructured surface with 3D features).

In a first aspect, the present invention provides a heating device 100 for heating the surface of a substrate 140. The heating device comprises a gas source 110 comprising an inert material supply. The inert material is inert under the operating conditions of the heating device. Such an inert material supply may be for example a solid inert material that is converted into gas using the gas source or for example an inert gas supply. The gas source is adapted for supplying a hot jet of gas on the substrate surface wherein the gas comprises at least elements of the inert material. These elements may for example be noble elements. This gas source is adapted for heating this hot jet of gas to a temperature above 1500° C. up to 2500° C. or even up to 4100° C. or even above 4100° C.

By heating the surface of the substrate using a heating device according to embodiments of the present invention only the surface atoms of the substrate are heated and not the bulk of the substrate. The hot jet of gas permits to give more energy to the surface atoms than to the atoms in the bulk of the substrate.

In embodiments of the present invention the gas source is adapted for supplying a hot jet of gas wherein the hot jet of gas comprises inert elements and reactive elements. The different elements may be supplied simultaneously or sequentially.

In embodiments of the present invention the gas source may be adapted for supplying a hot jet of gas comprising only elements of the inert material.

In embodiments of the present invention the gas source is adapted for supplying a hot jet of gas wherein the hot jet of gas at least comprises inert elements and for supplying a cold jet of gas wherein the cold jet of gas comprises reactive elements.

Reactive elements which can be used are for example hydrogen, oxygen, nitrogen. This will not only lead to heating the surface but will advantageously also lead to enhanced reduction, oxidation and/or nitridation and other reactions. This process also may include the use of the reactive gases applied "cold", i.e. they are not heated or cooled intentionally, in combination with the hot inert (e.g. noble) gases.

In embodiments of the present invention the gas source 110 comprises an effusion cell or a tube furnace. In these embodiments the heat source may be filaments. These filaments may be made of metallic elements or dedicated compounds which can stand temperatures above 1500° C.

In embodiments of the present invention the gas source 110 comprises a crucible. Also the crucible is made of material which can stand temperatures above 1500° C.

If the crucible is made of graphite and the heater filaments of tantalum or tungsten then gas temperatures up to 2500° C. or even 3000° C. or even 4100° C. may be reached.

For tube furnaces, filaments can also be ceramic such as Kanthal (these are iron-chromium-aluminum alloys) or graphite elements or Hf—Ta—C. In the case of an effusion cell, the filament preferably surrounds a crucible within which gaseous species are kept. Upon putting a current through the filaments, the crucible is heated. Typically the temperature of the crucible is adjusted to evaporate the material kept inside the crucible. In embodiments of the present invention this material in the crucible is made of inert gases. The evaporation thereof thus causes a hot jet of inert gases. In embodiments of the present invention combinations of noble and reactive gasses may also be produced.

In one experimental realization, the gas source 110 comprises a crucible which comprises a bottom part which is a gas feeding tube and a top part which is a cover. Preferably the realized crucible is made of one part. The gas feeding tube preferably brings the gas inside the crucible where it can be heated. In the cover plate, small holes are drilled so that the gas can escape. In this system, the temperature of the gas may be the same or nearly the same as the temperature of the crucible. When high temperatures are preferred, the crucible comprising the bottom part and the top part is made of the materials that are resistant to the highest temperatures such as graphite or Hf—Ta—C.

In embodiments of the present invention a high temperature furnace is used (e.g. a furnace which can heat up to at least 1500° C. or even up to at least 3500° C.). In these embodiments a small gas inlet is attached on one side of that high temperature furnace and a gas outlet is attached to the other side. By providing a gas flow to enter the high temperature furnace, a hot gas stream can be obtained at the gas outlet. A substrate can be positioned in the stream of the hot gas.

In embodiments of the present invention the pressure of the gas can be adapted to the process requirements including low-pressure operation, atmospheric pressure operation or even higher pressure operation.

Instead of using a filament and current to change the temperature, other means can be used to change the temperature of the crucible or the tube. This can be done for instance by using electron bombardment from a filament in a configuration (e-beam heating system) which is similar like an electron beam gun. Another implementation may be to use light from a laser or of lamps to heat the gasses and care is preferably taken to avoid that any charged particles exit the crucible. With lasers much higher gas temperatures up to 10,000 C can in principle also be reached but are them harder to confine in a source or a cell.

In an alternative embodiment of the present invention the gas source 110 comprises a plasma environment (for example like in a gas tube). The gas source moreover comprises a means for extracting the gas from the plasma environment. This may for example be used to create an argon plasma gas. Typically when for instance an argon plasma is created, it comprises charged elements of different polarity including electrons and ions whereby the latter can be multiply charged. In addition a set of excited elements are also created but in a neutral state. In embodiments of the present invention the gas source 110 comprises a means for removing all charged elements from the gas flow. This means can for example comprise metallic plates on which a potential is applied to attract the different charged elements. In embodiments of the present invention such a plasma is excited through the use of an RF coil that surrounds the gas tube and that is connected to an RF power supply.

In another embodiment of the present invention the gas source 110 comprises DC plasma sources whereby a potential is applied across two plates with the gas flowing in between these two plates.

In yet another embodiment of the present invention mixtures of gases can be used either in a heated source configuration, a laser source configuration or in a plasma configuration. This may be implemented to optimize the amount of energy transfer to the substrate 140.

In yet another embodiment of the present invention, a plurality of gas sources may be combined together. For instance one gas source 110 may run argon gas at 2000° C., while another source may run oxygen gas at a high temperature e.g. at 2000° C. They may also run at different temperatures and/or pressures. In embodiments of the present invention a high oxygen temperature may facilitate reactions such that for instance a factor 10 lower pressure but a high temperature is preferable over the standard low temperature oxygen gas.

In some molecular beam epitaxy processes, surface preparation steps are preferably used whereby heating of the substrate is required for instance to desorb impurities or to induce a specific surface reconstruction. This preparation can also fully be prepared with the hot gas source either as the only heating source or in conjunction with an intermediate substrate heating level. An illustrative example is the cleaning of HF prepared silicon substrates. These surfaces are hydrogen terminated upon insertion into the vacuum system. Upon heating the substrate to about 500° C., preferably above 1500° C., the hydrogen species desorb as can be easily determined using a quadrupole mass spectrometer. The same phenomenon can be easily observed by supplying a source of hot gas to the substrate.

In embodiments of the present invention the gas source 110 is configured such that the amount of gas flow can be changed as a function of time. This flow may for example be adjusted between 0.1 and 1000 SCCM (standard cube centimeters per minute). It is an advantage of embodiments of the present invention that the gas flow can be adopted to the process requirements. This includes also variations in pressure and temperature in single ramps, multiple ramps, periodic oscillation or any irregular pattern as optimized for a given process.

In embodiments of the present invention the distance between the outlet of the gas source 110 (e.g. the outlet of the high temperature furnace) and the substrate 140 can be adjusted. This distance can for example range between 1 mm and 100 cm.

In embodiments of the present invention the heating device 100 may be integrated into a deposition and/or etching and/or annealing system. This may be done by positioning the gas source 110 in the system such that the gas source 110 is in close proximity of the substrate 140 when the substrate is in the system. The gas source 110 is thereby oriented such that in operation the hot jet of gas is directed towards the surface of the substrate 140 which is to be heated. In many systems the wafer surface faces upwards, and the species to be deposited come from the top. For instance in ALD, sputtering or (P)-CVD systems such a configuration is typically used. In embodiments of the present invention, the hot gas source may also be added on top. In embodiments of the present invention the heating device 100 may comprise a hollow perforated tube, for instance a hollow graphite tube with perforated holes. When integrated in the system these holes are pointing towards the substrate area, when the substrate is mounted in the system such that in operation the hot jet of gas is evaporated on the surface of the substrate. The heating device, for example comprising a graphite tube, can be heated by passing current through it. In embodiments of the present invention the heating device, for example the graphite tube, is preferably positioned close to the substrate 140. If the heating device comprises a graphite tube, the graphite tube can be a single tube or it can be a meandering structure made in such a way that other process gasses can still flow through and reach the substrate.

In embodiments of the present invention the heating device 100 comprises a cooling shroud 160 wherein the cooling shroud is adapted for being mounted around the gas source 110 such that, when mounted, it is adapted for allowing the hot jet of gas to pass towards the substrate 140 and it is adapted for reducing the radiation from the gas source 110 towards the substrate 140. In embodiments of the present invention, the gas source 110 comprises for example a tube which is hot during operation. In embodiments of the present invention radiation from the gas source (e.g. the hot tube) is prevented from reaching the substrate 140. This radiation would cause heating of the substrate. It is an advantage of embodiments of the present invention that by providing the cooling shroud 160 heating of the substrate is avoided because the cooling shroud 160 absorbs radiation coming from the gas source 110.

In other alternative systems according to embodiments of the invention, the substrate 140 faces downward, and the evaporating species are coming from the bottom upwards. This is often the case for molecular beam epitaxy systems although even for these, different orientations have been demonstrated as well. Nevertheless, in a conventional system the sources are collected at the bottom of the chamber and are pointing upwards. In these systems the heating device 100 is preferably added at the bottom of the chamber. The heating device 100 according to embodiments of the present invention may for example replace an effusion cell. In embodiments of the present invention the distance between the substrate 140 and the gas source 110 can be adjusted for optimum performance between only a few millimeters up to tens of centimeters. In embodiments of the present invention this distance may be variable during the operation and/or in between operations.

The experimental realizations for integrating a heating device 100 according to the present invention into an etching systems, an annealing systems, or a deposition system are very similar with each other.

In embodiments of the present invention the shape of the heating device 100 and the position of the heating device in the etching, annealing or deposition system may vary depending on the system and on the heating device itself. The gas source 110 may for example comprise a cylinder circling inside the system with the hot gas orifices pointing to the substrate 140. It is thereby an advantage that most of the substrate 140 remains accessible for all other processes already taking place. It is an advantage of embodiments of the present invention that heating devices according to embodiments of the present invention can be included as an add-on option to existing systems.

A schematic drawing of a heating device 100 in accordance with embodiments of the present invention is illustrated in FIG. 1. The drawing shows a heating device 100 comprising a gas source 110, a temperature controller 120, a pressure controller 130, a flow controller 170, a cooling shroud 160 and a substrate holder 150. The drawing also shows a substrate 140 on the substrate holder 150.

In a second aspect, the present invention provides a method for treating the surface of a substrate. The method comprises a step heating the surface of the substrate using a hot jet of gas wherein at least part of the elements in the gas are inert under the operating conditions of the heating device and wherein the gas is heated to a temperature above 1500° C.

In embodiments of the present invention the hot jet of gas is a continuous flux of hot gas. This hot jet of gas may be supplied during the growth of a thin film. It is an advantage of embodiments of the present invention that the hot gas, for instance argon, gives enough energy to the growing surface to help the crystallization of the thin film. It is thereby an advantage of embodiments of the present invention that not the complete substrate 140 is heated, as is the case in prior art systems, but that only the top surface atoms of the substrate is heated. In embodiments of the present invention, the depth to which the surface of the substrate is heated can for example be regulated by controlling the speed and temperature of the hot jet of gas. The depth may be several nanometers deep (e.g. 0.1 nm deep, or even 1 nm deep, or even 10 or 100 or 1000 nm deep). It is an advantage of embodiments of the present invention that the thermal energy of the gaseous species is given to a few surface atoms so that they can form a crystalline nucleus or a growth front can be continued.

In alternative embodiments of the present invention a pulsed flux of hot gas may be used. In that case first all the atoms preferably forming a unit cell of the required compound, can be deposited on the substrate for instance and then the temperature is increased under the bombardment of the hot gas. This process can be advantageous compared to the regular thin film deposition processes where partial unit cells are continuously formed at high temperature but that is frequently and inherently not as stable as the full unit cells, in particular for the complex unit cells. For instance for some compounds a high temperature is required to form a crystal but at that temperature part of the material will evaporate. This is for example the case for InGaZnO compounds. In embodiments of the present invention such compounds are deposited in a structure of 3 monolayers with the most stable layer as last layer. Afterwards the structure is heated and reacts to form a crystal. It is an advantage of this method according to the present invention that less material re-evaporates than in the standard process where all three elements are evaporated simultaneously.

In embodiments of the present invention a flux of hot gas is applied for supporting the growth of thin films.

In further embodiments of the invention, the above-mentioned two methods may be used in combination with a varying substrate temperature. The substrate temperature can be cooled or heated to adjust the thermal budget to which the surface is exposed. This can be optimized for instance to prevent the appearance of defects in the grown material.

In embodiments of the invention a combination of hot gases and cold gases can be used as well. The use of cold gases for instance in a pulsed combination with the hot gases offers additional process tuning possibilities.

In an exemplary embodiment of the present invention the substrate temperature remains at room temperature, while the hot gas source 110 is heated up to 4100° C. with Argon gas for instance. For this source, the graphite or the Hf—Ta—C based example may be used. The filament of the gas source is preferably turned on and fed with an appropriately high current as to deliver the high temperature inside the crucible of the source. Next a flow of for instance cold Argon is fed through the source and together with the pressure in the source and the number of holes from which the hot Argon can diffuse out, the experimental parameters are fixed. The flux of hot Argon determines the substrate surface temperature. Different process regimes are possible. In one regime the hot gas and the evaporant fluxes are preferably provided simultaneously to the substrate 140. It is thereby an advantage of embodiments of the present invention that the surface layer temperature remains constant during the growth process.

In other embodiments of the present invention, depending on the process requirements, the temperature controller may be configured to vary the surface layer temperature during the process.

In embodiments of the present invention the hot jet process may be used for a solid phase epitaxy process whereby first all the required elements are deposited on the substrate at low temperature and in a nearly amorphous state, and then preferably an annealing treatment is performed whereby the film is crystallized.

In embodiments of the present invention the timing of the fluxes is varied such that the deposition and the heating are not happening simultaneously but rather sequentially. This is advantageous for instance in molecular beam epitaxy which is a rather low pressure deposition technique. In molecular beam epitaxy it may therefore be difficult to obtain a high substrate surface layer temperature while maintaining a good vacuum condition. By alternating a low pressure deposition step with a higher pressure annealing step, according to embodiments of the present invention, a high surface layer temperature can be obtained. It is an advantage of embodiments of the present invention that similar schemes can be implemented in all thin film deposition systems.

Methods according to embodiments of the present invention may comprise a preheating step, partially preheating the substrate 140. The substrate may for example be preheated to 300 degrees Celsius. It is thereby an advantage that a smaller temperature interval needs to be crossed during the heating step of the substrate surface with the hot jet of gas.

In some general thin film deposition processes, surface preparation steps may be used, whereby heating of the substrate 140 may be applied for instance to desorb impurities or to induce a specific surface reconstruction. In embodiments of the present invention these preparation steps are performed with the hot gas source 110 either as the only heating source or in conjunction with an intermediate substrate heating step. An illustrative example is the cleaning of HF prepared semiconductor, e.g. silicon, substrates. These surfaces are hydrogen terminated upon insertion into the vacuum system. Upon heating the substrate to about 500° C., the hydrogen species desorb as can be easily determined using a quadrupole mass spectrometer. It is an advantage of embodiments of the present invention that the same phenomenon can be achieved by heating the surface of the substrate using a hot jet of gas in accordance with embodiments of the present invention.

In embodiments of the present invention heating of the surface of a substrate 140 using a hot jet of gas may be applied in systems wherein high pressure processes are already present. This includes processes such as ALD, sputtering, CVD, PCVD, MOCVD etc. Again the substrate can be preheated to a certain value either using the standard substrate heating mechanisms, using the hot gas source 110 or using a combination of both. It is an advantage of embodiments of the present invention that using the hot jet of gas the surface layer can be heated to a higher temperature (e.g. above 1500° C.) as this may provide additional possibilities for cleaning and growth. A few interesting examples are those of the growth of SiC and of diamond. Both materials require a very high temperature which is not accessible for the growth on silicon. It is therefore an advantage of embodiments of the present invention that very high substrate surface layer temperatures can be obtained. Local temperatures up to 4100 degrees Celsius may be obtained for the top surface atoms in combination with the hot gas jet. These temperatures are much higher than what is feasible under usual thin film conditions. It is an advantage of embodiments of the present invention that these high temperatures at the surface of the substrate 140 enable thin film growth processes for materials which cannot be grown currently or not in the desired quality. Examples of such thin films are InGaZnO, SiC, diamond.

Heating of the surface of a substrate 140 using a hot jet of gas in accordance with embodiments of the present invention may also be applied for annealing processes. In these embodiments a heating step is applied during a predetermined time. The process may be complemented by adding additional gaseous reactive elements such as to induce an oxidation anneal or a reduction anneal, if required. An example on standard treatment in the literature is a forming gas anneal using for instance a mixture of Argon and Hydrogen at a substrate temperature of 350-450 degrees Celsius. A similar process can be done using the hot gas approach.

Heating of the surface of a substrate using a hot jet of gas in accordance with embodiments of the present invention may also be applied for etching processes. This can be done in a global manner but it can also be done using the standard lithography procedures whereby masks and resists—or solid layers—are used to define areas wherein the material can be removed. For the etching process, the mechanism that is preferably used in this invention is the re-evaporation of material when treated to a high temperature step. For simple metals and elements the re-evaporation rates are well defined as a function of temperature and pressure. In embodiments of the present invention a compound gas mixture may be used for a reactive etching process. Such a gas may for example comprise fluorides and/or borides. The reactive gasses may be supplied at high temperature or at low temperature. When supplied at low temperature the substrate may for example be preheated using a hot jet of gas. It is an advantage of embodiments of the present invention that heating of the surface of the substrate 140 using a hot jet of gas (>1500° C.) allows to develop good etching processes without the need of adding ionic and radical components to the gas mixtures.

Heating of the surface of a substrate using a hot jet of gas in accordance with embodiments of the present invention may also be applied to form evaporation sources by etching away material from a material source. Like in ALD and CVD processes where the precursor vapor are carried with the help of carrier gas at a relatively high pressure, the same can be done here. One advantage of this method is that also the pure elements can be evaporated even those that require a very high evaporation temperature. It is moreover an advantage of embodiments of the present invention that they can be used both for elemental materials as for different compounds. In embodiments of the present invention the hot jet of gas is supplied to a crucible wall whereby the crucible material is made of the material one wants to evaporate. It is an advantage of embodiments of the present invention that thereby a new elemental deposition source is created. The elemental deposition source comprising a heating device 100 according to embodiments of the present invention and a crucible wall made of the element one wants to deposit. The crucible wall and the heating device are thereby positioned such that, when operational, the hot jet of gas of the heating device passes at the surface of the crucible wall thereby removing atoms from the crucible. Under the appropriate conditions of temperature, pressure and flow, a significant density of crucible atoms will evaporate and become part of the gas stream. This gas stream can then be driven over the surface of a substrate 140 and lead to the deposition of the said element. This process will be particularly useful for metals which have a low vapor pressure such as for instance Hf (hafnium). These materials typically require temperatures in excess of 2200° C. for a flux to appear. It is an advantage that this hot jet of gas can be provided using a heating device 100 in accordance with embodiments of the present invention. In prior art systems these metals may be evaporated using electron beam guns or alternatively the metal is packed inside an organic compound in processes such as ALD and CVD but unfortunately these also may contain a lot of unnecessary carbon that preferably is removed subsequently.

Heating of the surface of a substrate 140 using a hot jet of gas in accordance with embodiments of the present invention may also be applied for surface cleaning. By applying a hot jet of gas, i.e. with an energy which is high enough to evaporate impurities from the surface, the surface can be cleaned.

Heating of the surface of a substrate 140 using a hot jet of gas in accordance with embodiments of the present invention may also be applied to obtain a thin film with gradient composition and/or strain. As opposed to prior art methods where a high temperature substrate is used, this can be done by adjusting the composition and/or the temperature of the hot jet of gas while growing the thin film. In embodiments of the present invention the gas elements can be changed during the growth of the thin film either in a pulsed fashion, a gradient fashion, in a bilayer fashion or in a multilayer fashion. Controlling the depth of the heating profile can be done by selection of the elements of the jet of hot gas. The gas source may for instance be adapted for evaporating elements which have a predetermined atomic radius. The depth can be limited to only the surface atoms by using heavy elements. With very light elements it is possible to go subsurface partially due to channeling processes. Heavy and light elements can alternate both with different duration and pressure.

Heating of the surface of a substrate 140 using a hot jet of gas in accordance with embodiments of the present invention may also be applied to flatten the surface of the substrate. This may be done by heating the surface at a temperature which is high enough to melt and flatten the surface of the substrate or of a deposited film or structure.

Heating of the surface of a substrate 140 using a hot jet of gas in accordance with embodiments of the present invention may also be applied for rapid thermal annealing (RTA) including rapid cooling. It is thereby an advantage of embodiments of the present invention that only the surface of the substrate is heated and that therefore the cooling rate is much faster than in the case the complete substrate would have been heated. This is particularly advantageous since in most RTA applications the limiting factor is the speed at which the substrate 140 can cool down again. Since there is a very high substrate mass, the cooling rate is defined by that of the substrate mass when the complete substrate is heated.

The invention claimed is:

1. A heating device for heating the surface of a substrate, the heating device comprising:
    a gas source comprising an inert material supply, the inert material being inert under the operating conditions of the heating device, the gas source being adapted for applying a hot jet of gas comprising at least elements of said inert material on a first surface of the substrate and the gas source being adapted for heating the hot jet of the gas to a temperature above 1500° C.; and
    a substrate holder, the substrate being configured to removably attach to the substrate holder at a second surface of the substrate, such that the hot jet of gas is not applied to the second surface of the substrate;
    wherein the first surface of the substrate is provided with a thin film material.

2. A heating device according to claim 1, wherein the gas source is adapted for applying a hot jet of a gas comprising furthermore reactive elements on the substrate, said reactive elements being reactive with the thin film material.

3. A heating device according to claim 1, wherein the gas source is adapted for applying a hot jet of gas comprising only elements of the inert material on the substrate.

4. A heating device according to claim 3, wherein the gas source is adapted for applying both the hot jet of gas and a cold jet of gas of reactive elements on the first surface of the substrate.

5. A heating device according to claim 1, the device comprising a temperature controller for controlling the temperature of the gas emanating from the gas source and/or a pressure controller for controlling the pressure of the gas emanating from the gas source and/or a flow controller for controlling how much gas is streaming through.

6. A heating device according to claim 1, wherein the gas source is adapted for evaporating elements which have a predetermined atomic radius.

7. A heating device according to claim 1, wherein the gas source is an effusion cell with a nearly closed crucible made of graphite and wherein the gas source comprises a heater for heating the crucible wherein the heater comprises filaments made of tantalum or tungsten or wherein the heater comprises an e-beam or wherein the heater comprises a laser beam.

8. A heating device according to claim 1, wherein the gas source is configured for generating a continuous hot jet of gas on the first surface of the substrate.

9. A heating device according to claim 1, wherein the gas source is configured for generating a pulsed hot jet of gas on the first surface of the substrate.

10. A heating device according to claim 1, wherein the substrate holder is adapted for cooling and/or heating at least the second surface of the substrate.

11. A heating device according to claim 1, the device comprising a cooling shroud wherein the cooling shroud is adapted for being mounted around the gas source wherein, when mounted, it is adapted for allowing the hot jet of gas to pass towards the substrate and it is adapted for reducing the heat radiation from the gas source towards the substrate and any other elements by shielding the substrate and the other elements from the gas source.

12. A heating device according to claim 1 wherein the gas source is adapted for changing the elements of the hot jet of gas during operation of the device, such that the hot jet of gas may include both different reactive elements and/or the inert material during operation of the device.

13. A heating device according to claim 1 wherein the gas source is adapted for generating an additional jet of gas below 1500° C., the additional jet of gas being applied on the first surface of the substrate.

14. A method for treating a surface of a substrate, the method comprising: removably attaching the substrate to a substrate holder at a second surface of the substrate, heating a first surface of the substrate opposite the second surface of the substrate attached to the substrate holder using a hot jet of gas, wherein at least part of the elements in the gas are inert under the operating conditions of the heating device and wherein the gas is heated to a temperature above 1500° C., such that the hot jet of gas is not applied to the second surface of the substrate, wherein the first surface of the substrate is provided with a thin film material.

15. A method according to claim 14, wherein the hot jet of gas comprises inert and reactive elements or wherein the hot jet of gas comprising inert elements is alternated with a cold jet of gas comprising reactive elements.

16. A method according to claim 14, the method comprising a deposit step for depositing the thin film material on the first surface of the substrate, followed by the heating step which causes an annealing treatment wherein the formed film is crystallized.

17. A method according to claim 14, wherein the heating step heats only the first surface of the substrate without heating a bulk volume of the substrate, such that a temperature of the bulk volume of the substrate remains the same as or lower than a temperature of the first surface of the substrate.

* * * * *